US007495441B2

(12) United States Patent
Amor et al.

(10) Patent No.: US 7,495,441 B2
(45) Date of Patent: Feb. 24, 2009

(54) MAGNETIC RESONANCE IMAGING SCANNER WITH MOLDED FIXED SHIMS

(75) Inventors: William H. Amor, Chagrin Falls, OH (US); Dennis K. Everett, Seven Hills, OH (US); Jerome S. Alden, Niskayuna, NY (US); Robert G. Henderson, Wickliffe, OH (US); Terrence M. Doyle, Hudson, OH (US); Ronald B. Sharpless, Cleveland, OH (US); Gerardus B. J. Mulder, Best (NL); Gerardus N. Peeren, Best (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 596 days.

(21) Appl. No.: 10/558,768

(22) PCT Filed: Apr. 19, 2004

(86) PCT No.: PCT/IB2004/001530

§ 371 (c)(1),
(2), (4) Date: Nov. 30, 2005

(87) PCT Pub. No.: WO2004/106960

PCT Pub. Date: Dec. 9, 2004

(65) Prior Publication Data

US 2007/0030004 A1 Feb. 8, 2007

Related U.S. Application Data

(60) Provisional application No. 60/474,637, filed on May 30, 2003.

(51) Int. Cl.
*G01V 3/00* (2006.01)

(52) U.S. Cl. .................................................... 324/318
(58) Field of Classification Search ................. 324/318
See application file for complete search history.

(56) References Cited

U.S. PATENT DOCUMENTS

| 5,349,297 | A |   | 9/1994  | DeMeester et al. | 324/318 |
| 5,550,472 | A | * | 8/1996  | Richard et al.   | 324/320 |
| 5,701,112 | A | * | 12/1997 | Brown            | 335/216 |
| 5,786,695 | A |   | 7/1998  | Amor et al.      | 324/320 |
| 6,867,592 | B2| * | 3/2005  | Gebhardt et al.  | 324/318 |

FOREIGN PATENT DOCUMENTS

| EP | 0 710 851 A1 | 5/1996  |
| EP | 0 715 181 A1 | 6/1996  |
| EP | 0737867 A1   | 10/1996 |
| EP | 0896228 A1   | 2/1999  |

* cited by examiner

*Primary Examiner*—Brij B. Shrivastav
*Assistant Examiner*—Megann E Vaughn (57) ABSTRACT

A magnetic resonance imaging scanner includes a generally cylindrical main magnet assembly (10) that defines a cylinder axis (16). A first set of shims (60) are rigidly positioned inside the magnet assembly (10) at about a first distance (d1) relative to the cylinder axis (16). A second set of shims (62) are rigidly positioned inside the main magnet assembly (10) at about a second distance (d2) relative to the cylinder axis (16). The second distance (d2) is different from the first distance (d1). A generally cylindrical radio frequency coil (26) is arranged inside the main magnet assembly (10) at about a third distance (d3) relative to the cylinder axis (16). A plurality of gradient coils (20) are arranged inside the main magnet assembly (10) at about a fourth distance (d4) relative to the cylinder axis (16).

27 Claims, 7 Drawing Sheets

MAGNETIC RESONANCE IMAGING SCANNER WITH MOLDED FIXED SHIMS

CROSS REFERENCE TO RELATED APPLICATIONS

This application claims the benefit of U.S. provisional application Ser. No. 60/474,637 filed May 30, 2003, which is incorporated herein by reference.

The following relates to the diagnostic imaging arts. It finds particular application in magnetic resonance imaging using high-field, short-bore magnets, and will be described with particular reference thereto. However, it also finds application in other types of magnetic resonance imaging scanners.

In magnetic resonance imaging, high main ($B_0$) magnetic fields are beneficial. A high main magnetic field produces a stronger magnetic resonance signal and consequently higher signal-to-noise ratios. Presently, main magnets of high resolution magnetic resonance imaging scanners provide main $B_0$ magnetic field strengths of about 1.5 tesla. Scanners with main magnets that produce fields higher than three tesla are projected.

For a fixed magnet length, however, it becomes increasingly difficult to maintain magnetic field uniformity as the magnetic field strength increases. Hence, higher strength main magnets generally produce correspondingly smaller usable imaging fields of view. The field of view can be enlarged by going to longer magnet bores. However, longer bores raise patient access, claustrophobia, and other issues.

Each scanner typically has custom magnetic field shimming using shims of steel or another magnetic material to compensate for magnetic field non-uniformities. In one arrangement, the shims are mounted in trays that are supported by a gradient coil former. The placement of fixed steel closer to the imaging volume is complicated due to a large number of other components that are also disposed within the magnet bore. These other components include whole-body radio frequency coils and optional local radio frequency coils, gradient coils for producing magnetic field gradients in the x-, y-, and z-directions, and shield coils for shielding nearby structures from the gradient fields. The radio frequency coils in particular are placed inside the gradient coils and other metal structures so that the gradient coils do not affect the radio frequency coil. The radio frequency coils are preferably placed as close as practicable to the imaging volume. Steel placed close to the imaging volume is more effective for stretching the field of view, and strongly affects higher order magnetic field terms. Precise positioning of the fixed steel array is important for obtaining optimal performance.

The present invention contemplates an improved apparatus and method that overcomes the aforementioned limitations and others.

According to one aspect, a magnetic resonance imaging scanner is disclosed. A generally cylindrical main magnet assembly defines a cylinder axis. A first set of shims is rigidly positioned inside the main magnet assembly at about a first distance relative to the cylinder axis. A second set of shims is rigidly positioned inside the main magnet assembly at about a second distance relative to the cylinder axis. The second distance is different from the first distance. A generally cylindrical radio frequency coil is arranged inside the main magnet assembly at about a third distance relative to the cylinder axis. A plurality of gradient coils is arranged inside the main magnet assembly at about a fourth distance relative to the cylinder axis.

According to another aspect, a method is provided of making a magnetic resonance scanner. A first set of shims is rigidly positioned inside a main magnet assembly at about a first distance relative to a cylinder axis of the main magnet assembly. A second set of shims is rigidly positioned inside the main magnet assembly at about a second distance relative to the cylinder axis. The second distance is different from the first distance. A generally cylindrical radio frequency coil is mounted inside the main magnet assembly at about a third distance relative to the cylinder axis. A plurality of gradient coils are mounted inside the main magnet assembly at about a fourth distance relative to the cylinder axis.

According to yet another aspect, a method is provided of magnetic imaging with a magnetic resonance imaging scanner. The scanner includes a generally cylindrical main magnet assembly that defines a cylinder axis, a first set of shims rigidly positioned inside the main magnet assembly at about a first distance relative to the cylinder axis, a second set of shims rigidly positioned inside the main magnet assembly at about a second distance relative to the cylinder axis that is different from the first distance, a generally cylindrical radio frequency coil arranged inside the main magnet assembly at about a third distance relative to the cylinder axis, and a plurality of gradient coils arranged inside the main magnet assembly at about a fourth distance relative to the cylinder axis. A substantially uniform magnetic field is generated within a field of view by cooperation of the main magnet assembly and the first and second sets of shims. A magnetic resonance is excited within the field of view using one of the generally cylindrical radio frequency coil and another radio frequency coil. The magnetic resonance is spatially encoded using magnetic field gradients produced by the plurality of gradient coils. The excited and spatially encoded magnetic resonance is detected using one of the generally cylindrical radio frequency coil and another radio frequency coil.

One advantage resides in reduced manufacturing time and effort, and a streamlined construction workflow.

Another advantage resides in arrangement of shims in symmetric packages configured to have small net Z thrust forces, and radial forces that are directed generally outward toward the package support structure.

Another advantage resides in improved precision and reduced tolerances in placement of fixed steel in the magnet bore.

Another advantage resides in more efficient use of space within the magnet bore.

Yet another advantage resides in placement of steel close to the imaging volume to enlarge the field of view. For a given amount of steel, placement of the steel close to the imaging volume is relatively more effective for affecting the magnetic field as compared with placement of the steel farther from the imaging volume.

Numerous additional advantages and benefits will become apparent to those of ordinary skill in the art upon reading the following detailed description of the preferred embodiments.

The invention may take form in various components and arrangements of components, and in various process operations and arrangements of process operations. The drawings are only for the purpose of illustrating preferred embodiments and are not to be construed as limiting the invention.

Figure 1:
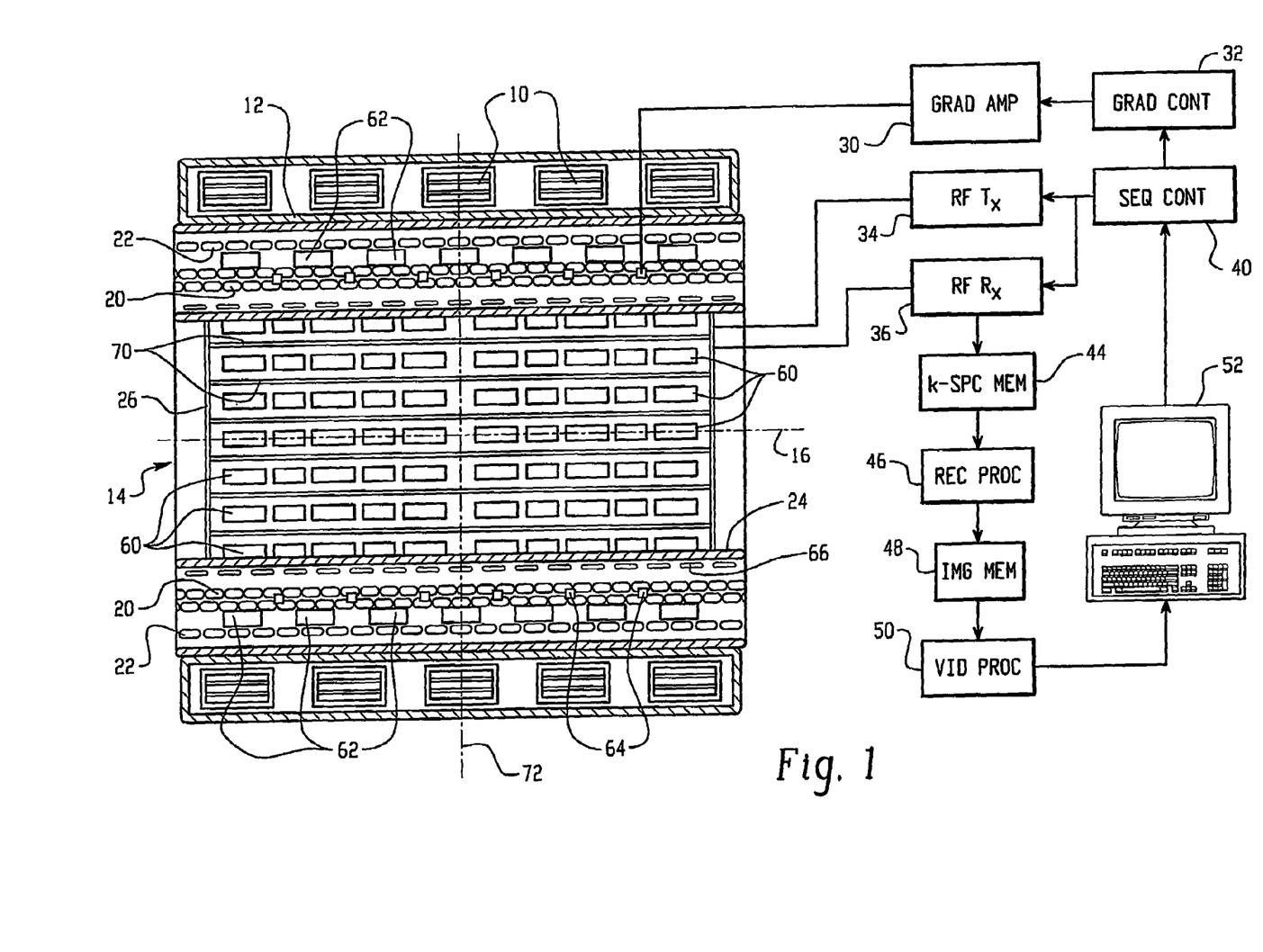
FIG. 1 diagrammatically shows a magnetic resonance imaging system including a diagrammatic side sectional view of a magnetic resonance imaging scanner.
Figure 2:
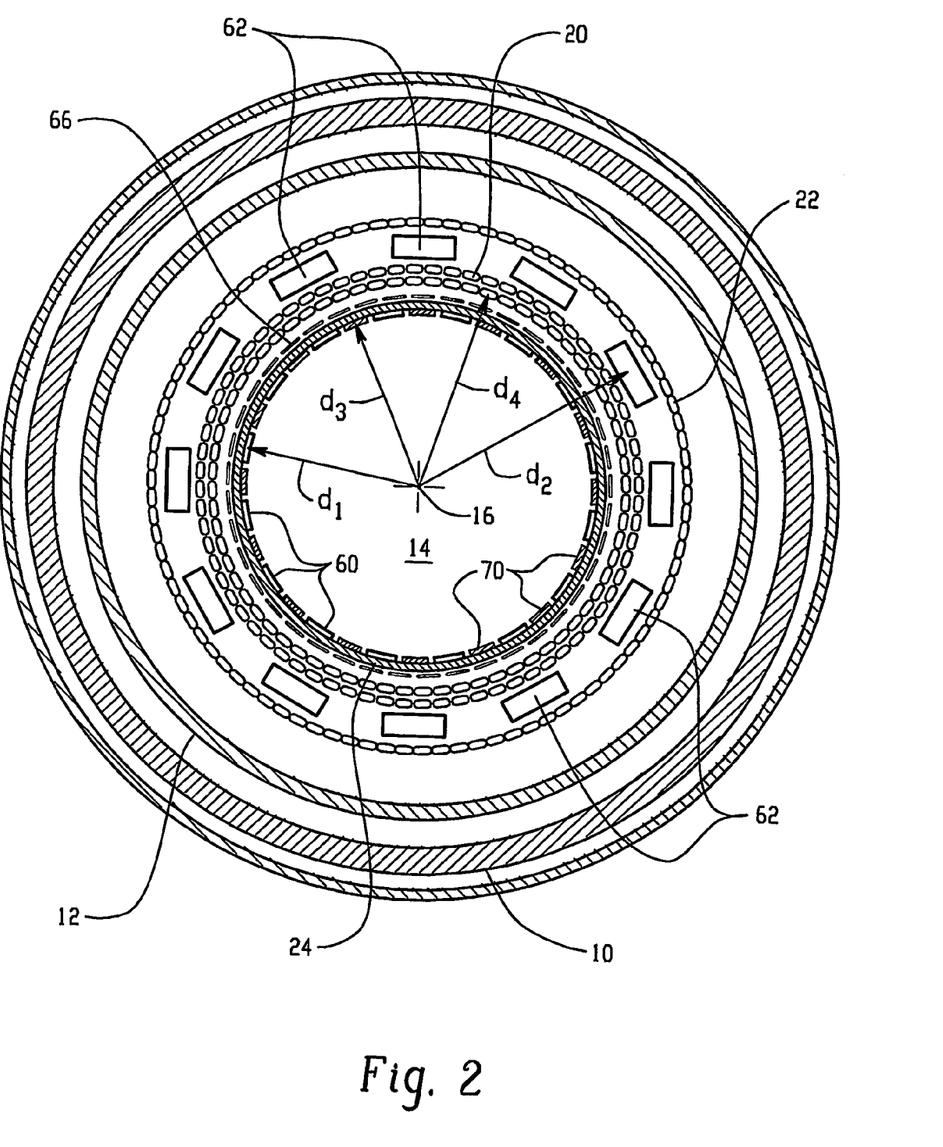
FIG. 2 diagrammatically shows an end view of the magnetic resonance imaging scanner of FIG. 1.
Figure 3:
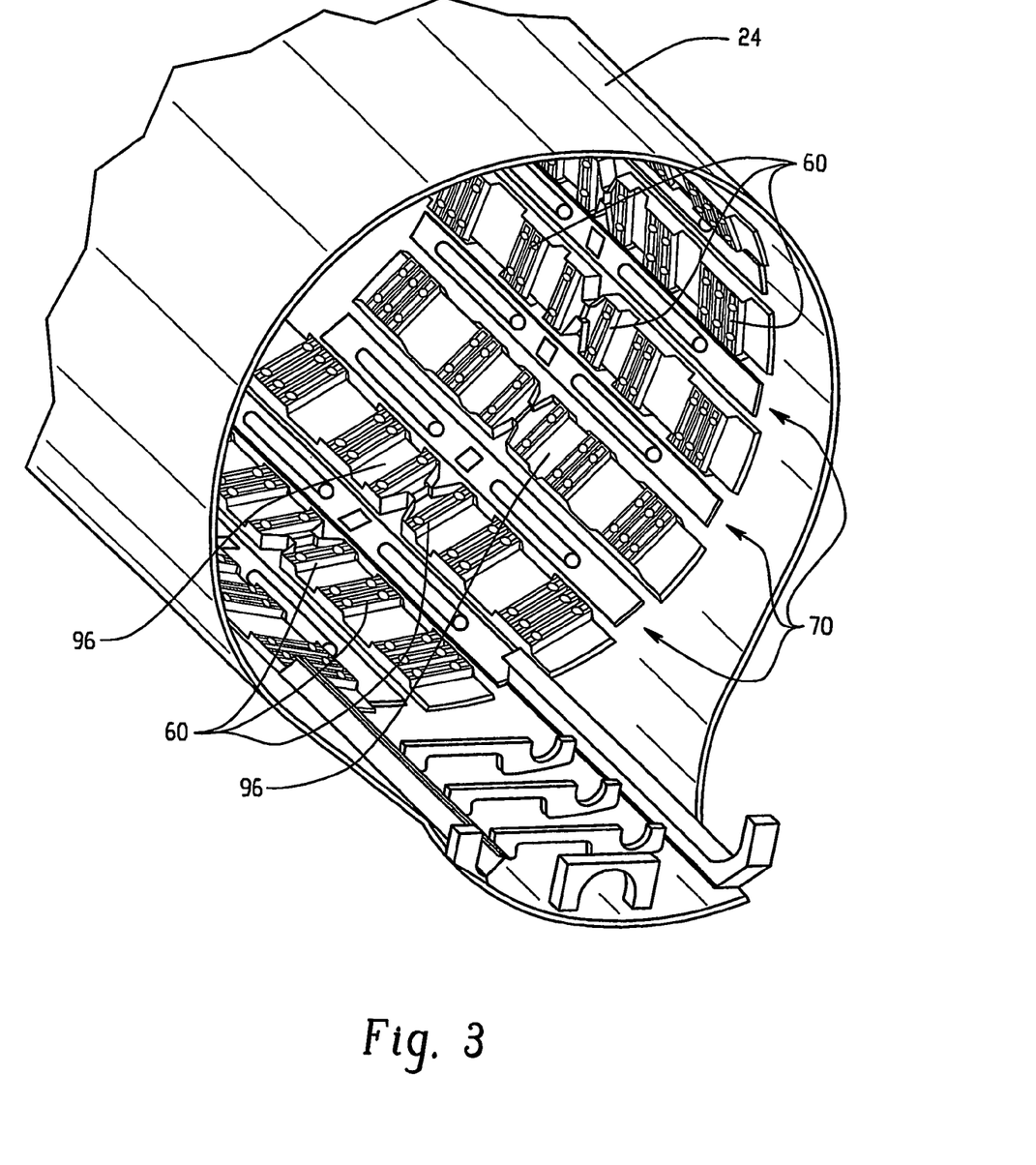
FIG. 3 shows a perspective view of a dielectric former of the magnetic resonance imaging scanner with a birdcage radio frequency coil and fixed shim packs secured thereto.

With reference to FIGS. 1-3, a magnetic resonance imaging scanner (shown diagrammatically in cross-section) includes annular main magnet assembly 10, which is preferably superconducting and surrounded by cold shields 12. The main magnet assembly 10 typically includes active shielding coils. The main magnets 10 and the cold shields 12 define a magnet bore 14 inside of which a patient or other imaging subject is placed for imaging. The main magnets 10 produce a spatially and temporally constant and uniform main magnetic field oriented along a longitudinal axis 16 of the bore 14. Instead of a superconducting magnet, a non-superconducting magnet can be used. In a preferred embodiment, the main magnets 10 define a short bore magnet of about 1.5 meters or less, and produce a high magnetic field of three tesla or higher in the magnet bore 14. However, the magnet can also be a longer bore magnet and/or produce a lower strength magnetic field.

Magnetic field gradient coils 20 produce magnetic field gradients in the bore 14 for spatially encoding magnetic resonance signals, for producing magnetization-spoiling field gradients, or the like. Preferably, the magnetic field gradient coils 20 include coils configured to produce magnetic field gradients in three orthogonal directions including the longitudinal axial direction parallel to the main magnetic field. For example, the gradient coils 20 can include x-gradient coils, y-gradient coils, and longitudinal z-gradient coils. Shield gradient coils 22 shield the main magnets 10 and electrically conductive portions of the cold shields 12 and surrounding structures from the gradient magnetic fields.

A generally cylindrical dielectric former 24 supports a radio frequency coil assembly 26 that generates radio frequency pulses for exciting magnetic resonances. The radio frequency coil assembly 26 also serves to detect magnetic resonance signals. Optionally, additional local radio frequency coils or phased radio frequency coil arrays (not shown) are included for exciting and/or detecting magnetic resonances at localized areas in the bore 14.

Gradient pulse amplifiers 30 deliver controlled electrical currents to the magnetic field gradient coils 20 to produce selected magnetic field gradients. Magnetic field gradient controllers 32 control the gradient pulse amplifiers 30. A radio frequency transmitter 34, preferably digital, applies radio frequency pulses or pulse packets to the radio frequency coil assembly 26 to generate selected magnetic resonance excitations. A radio frequency receiver 36 also coupled to the radio frequency coil assembly 26 receives magnetic resonance signals. If more than one radio frequency coil is provided (such as a local coil or phased coil array), then different coils are optionally used for the magnetic resonance excitation and detection operations.

To acquire magnetic resonance imaging data of a subject, the subject is placed inside the magnet bore 14, preferably at or near an isocenter of the main magnetic field. A sequence controller 40 communicates with the gradient controllers 32 and the radio frequency transmitter 34 to produce selected transient or steady state magnetic resonance configurations in the subject, to spatially encode such magnetic resonances, to selectively spoil magnetic resonances, or otherwise generate selected magnetic resonance signals characteristic of the subject. The generated magnetic resonance signals are detected by the radio frequency receiver 36, and stored in a k-space memory 44. The imaging data is reconstructed by a reconstruction processor 46 to produce an image representation that is stored in an image memory 48. In one suitable embodiment the reconstruction processor 46 performs an inverse Fourier transform reconstruction.

The resultant image representation is processed by a video processor 50 and displayed on a user interface 52, which is preferably a personal computer, workstation, or other type of computer. Rather than producing a video image, the image representation can be processed by a printer driver and printed, transmitted over a computer network or the Internet, or the like. Preferably, the user interface 52 also allows a radiologist or other operator to communicate with the magnetic resonance sequence controller 40 to select magnetic resonance imaging sequences, modify imaging sequences, execute imaging sequences, and so forth.

The main magnets 10 produce a substantially uniform magnetic field over an imaging field of view. To extend or stretch the field of view, a booster ring of fixed shims 60 is placed at about a radial distance d, relative to the cylinder axis 16 defined by the main magnet 10. Preferably, each fixed shim 60 includes one or more plates of steel or another magnetic material that are secured together to define a shim pack 60. The amount of magnetic material in each shim pack 60 corresponds to the number and thickness of secured steel plates. While the use of shim packs is preferred to facilitate mass production of shims of variable mass, it is also contemplated for each fixed shim to include a single unitary piece of steel or other magnetic material having a selected mass that may in general be different for each fixed shim.

Additionally, adjustable shims 62 are preferably selectably arranged at about a radial distance $d_2$ relative to the cylinder axis 16 to correct for manufacturing imperfections or other non-uniformities of the magnetic field in the imaging field of view. Typically, the adjustable shims 62 are also steel plates or plates of another magnetic material which are selectably placed into shim trays or other shim receptacles after manufacture of the main magnet 10 and with the booster ring of shim packs 60 in place. The adjustable shims 62 are selectively inserted during initial magnet calibration to improve magnetic field uniformity within the field of view. Optionally, larger diameter ferrous shim rings 64 (shown diagrammatically in FIG. 1) are mounted in the primary gradient coil former.

The radio frequency coil assembly 26 is arranged at about a radial distance $d_3$ relative to the cylinder axis 16, while the magnetic field gradient coils 20 are arranged at about a radial distance $d_4$ relative to the cylinder axis 16. A metal radio frequency shield 66 shields the gradient coils 20 and other outer components from radio frequency signals generated by the radio frequency coil 26. Typically, a bore liner (not shown) is provided at a radial distance smaller than the radial distances of the active components to prevent contact with the active components of the scanner during imaging, and to improve the aesthetic appearance of the magnetic resonance imaging scanner 10.

In the illustrated embodiment, the first and second sets of shims 60, 62, the radio frequency coil 26, and the gradient coils 20 have or are arranged about circular cross-sectional shapes or contours, and are suitably described by distances $d_1$, $d_2$, $d_3$, $d_4$ which are radial distances. However, those skilled in the art will recognize that one or more of the first and second sets of shims, the radio frequency coil, and the gradient coils optionally have or are arranged about elliptical or other cross-sectional shapes or contours rather than the illustrated exemplary circular cross-sectional contours. Such non-radial configurations are described by a suitable distance from the cylinder axis. For example, a birdcage radio frequency coil having or arranged about an elliptical contour is suitably described by a distance from the cylinder axis to the coil along a major ellipse axis, a distance from the cylinder axis to the coil along a minor ellipse axis, or distance from the cylinder axis to the coil along an intermediate axis of the ellipse.

In a preferred embodiment, the distance $d_1$ at which the fixed shim packs 60 of the booster ring are disposed is smaller than the distance $d_2$ at which the adjustable shims 62 are selectably arranged. Shims placed relatively closer to the field of view have a relatively stronger effect on the higher order magnetic field harmonics, and so the preferred smaller distance $d_1$ causes the fixed shim packs 60 to adjust the higher order harmonics to effectively extend or stretch the field of view, that is, the region of substantially uniform magnetic field. The adjustable shims 62 are selectably arranged at the larger distance $d_2$ where they have a greater effect on lower order magnetic field terms.

To efficiently use space near the imaging volume within the bore 14, in a preferred arrangement the fixed shim packs 60 are disposed on the same dielectric former 24 on which the radio frequency coil assembly 26 is disposed. In this arrangement, the distance $d_1$ of the fixed shim packs 60 substantially equals the distance $d_3$ of the radio frequency coil assembly 26. The distance $d_4$ of the gradient coils 20 is preferably substantially larger than the distances $d_1$, $d_3$. In one preferred embodiment, the adjustable shims 62 are selectably arranged outside of the primary gradient coils 20; that is, the distance $d_2$ is greater than the distance $d_4$. However, the adjustable shims 62 can also be placed inside the primary gradient coils 20; that is, the distance $d_4$ of the gradient coils can be greater than or equal to the distance $d_2$ of the adjustable shims.

The fixed shim packs 60 are arranged between rungs 70 of the radio frequency coil assembly 26, which in a preferred embodiment is a birdcage coil. In the exemplary illustrated embodiment, the birdcage coil assembly 26 has sixteen rungs 70 arranged generally parallel to the cylinder axis 16, and the booster ring includes sixteen rows of fixed shim packs 60 arranged at radial positions between the radio frequency coil rungs 70. As best seen diagrammatically in FIG. 2, the fixed shim packs 60 are preferably arranged in a radially symmetric fashion respective to the cylinder axis 16. The fixed shim packs 60 are preferably also arranged with a bilateral symmetry about a longitudinal symmetry plane 72 (shown in FIG. 1) of the bore 14. The radial and bilateral symmetries promote controlled and symmetric modification of higher order terms of the main ($B_0$) magnetic field. In contrast, the adjustable shims 62 may optionally lack one or both of radial symmetry about the cylinder axis 16 and bilateral symmetry about the longitudinal symmetry plane 72.

By placing the fixed shim packs 60 of the booster ring close to the imaging volume, substantial stretching of the imaging volume is achievable with a limited amount of steel or other magnetic material. However, this close placement also leads to a high sensitivity to precise placement of the fixed shim packs 60. Moreover, the shim packs 60 generally experience substantial magnetic forces from the main $B_0$ magnetic field and from magnetic field gradients produced by the gradient coils 20. Hence, the fixed shim packs 60 should be precisely and rigidly secured to the dielectric former 24. In a preferred embodiment, the fixed shim packs 60 are secured to the dielectric former 24 through the use of plastic encapsulation.

Figure 4:
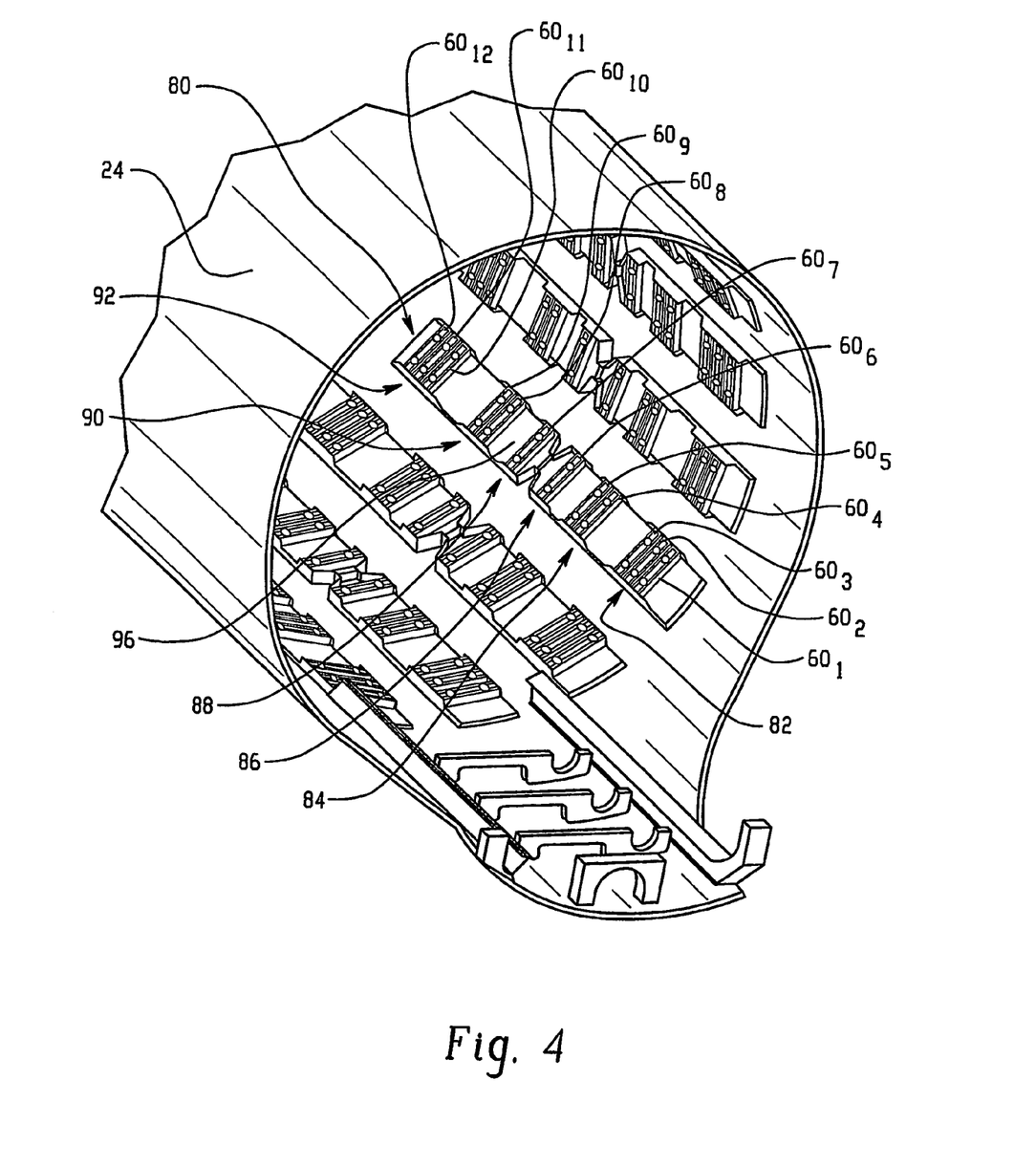
FIG. 4 shows the perspective view of FIG. 3, with the fixed shim packs secured to the dielectric former. The birdcage radio frequency coil has been removed in the view of FIG. 4.
Figure 5:
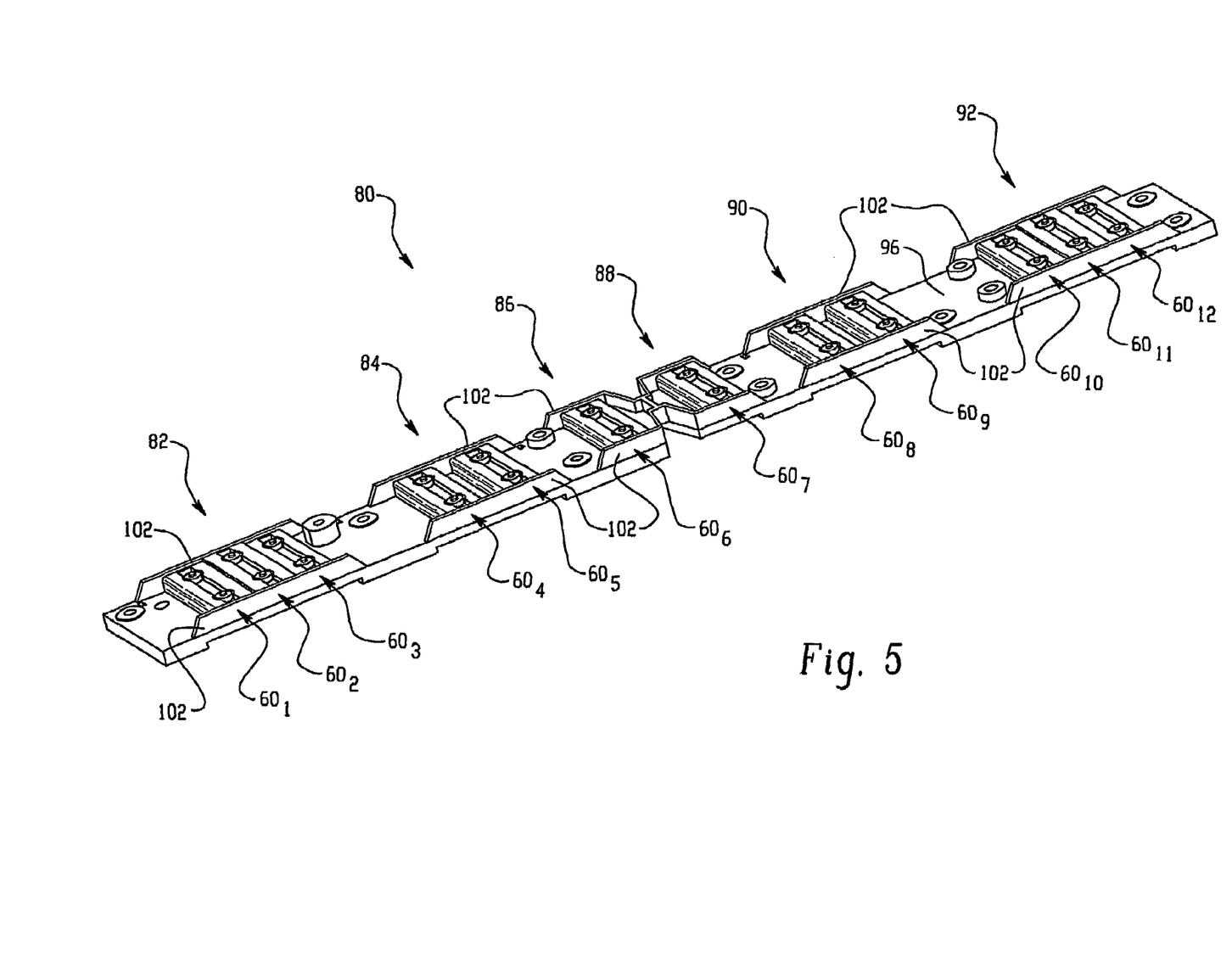
FIG. 5 shows exemplary moldings containing fixed shim packs bonded to a separately molded tray.
Figure 6:
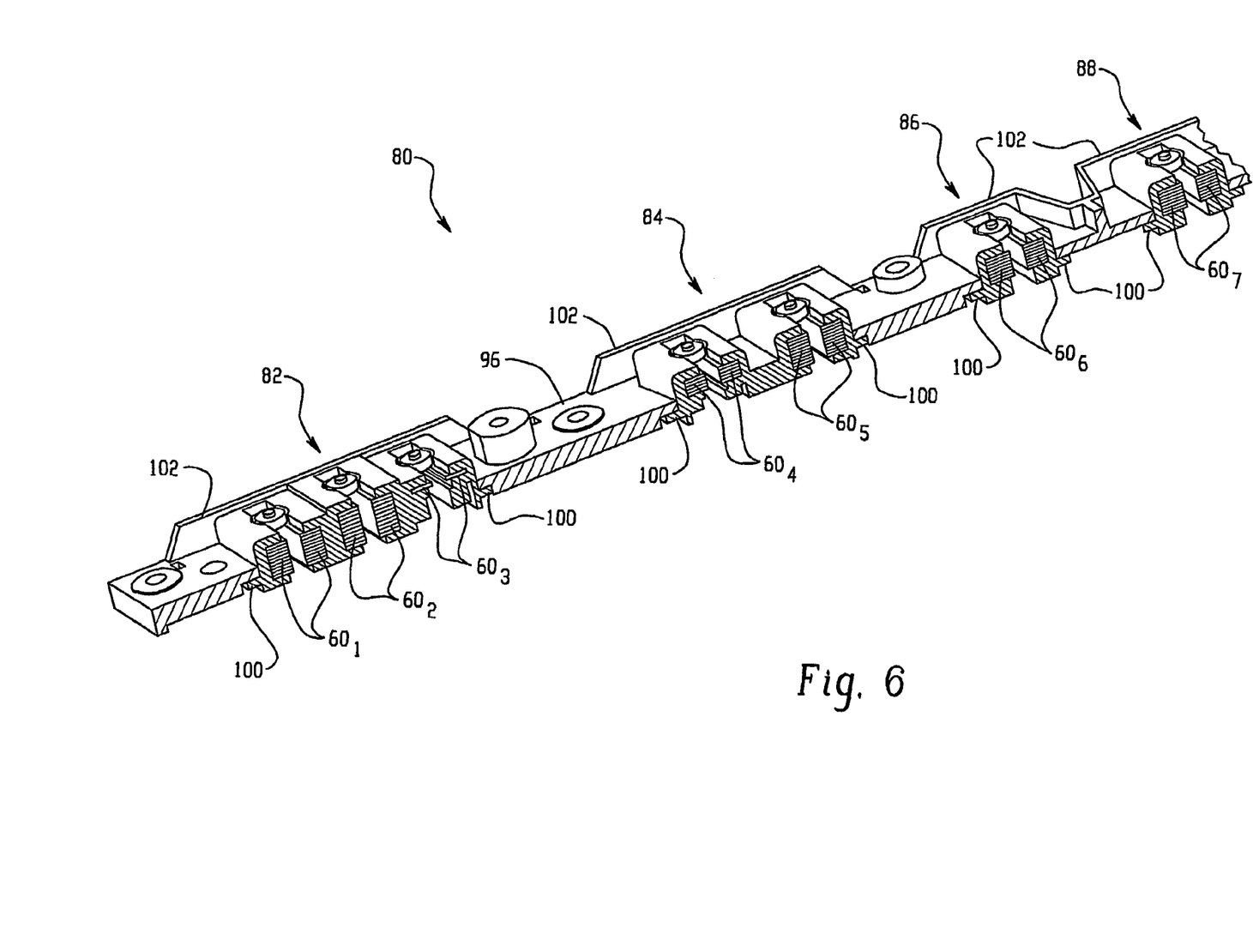
FIG. 6 shows a perspective sectional view of a portion of moldings and the separately molded tray of FIG. 5, with shim packs encapsulated by the moldings revealed by the section.

With reference to FIGS. 4 and 5, an exemplary molded strip 80 of twelve fixed shim packs $60_1$, $60_2$, $60_3$, $60_4$, $60_5$, $60_6$, $60_7$, $60_8$, $60_9$, $60_{10}$, $60_{11}$, $60_{12}$ is shown. FIG. 6 shows a cross-sectional view of a portion of the molded strip 80 including the first seven fixed shim packs $60_1$, $60_2$, $60_3$, $60_4$, $60_5$, $60_6$, $60_7$. In the illustrated embodiment, between one and three fixed shim packs is encapsulated in each molding. Thus, a molding 82 includes the shim packs $60_1$, $60_2$, $60_3$; a molding 84 includes the shim packs $60_4$, $60_5$; a molding 86 includes the shim pack $60_6$; a molding 88 includes the shim pack $60_7$; a molding 90 includes the shim packs $60_8$, $60_9$; and a molding 92 includes the shim packs $60_{10}$, $60_{11}$, $60_{12}$. Although between one and three shim packs are included in each molded pack of the illustrated embodiment, it is contemplated to include more than three shim packs in an encapsulation molding.

The moldings 82, 84, 86, 88, 90, 92 are secured to a separately molded tray 96. In a preferred embodiment, the moldings 82, 84, 86, 88, 90, 92 are secured by ultrasonic bonding to the separately molded tray 96. Each molding 82, 84, 86, 88, 90, 92 included mating extensions 100 (see FIGS. 6 and 8) that mate with and ultrasonically bond with corresponding surfaces of the separately molded tray 96. Additionally, the separately molded tray 96 includes extended sides 102 (see FIGS. 5-7) that further support and position the moldings 82, 84, 86, 88, 90, 92. Although ultrasonic bonding is preferred, other bonding techniques, such as potting or fastening by mechanical fasteners, are also contemplated for securing the moldings to the tray. The separately molded tray 96 is secured to the generally cylindrical dielectric former 22 by fasteners, ultrasonic bonding, or the like.

Figure 7:
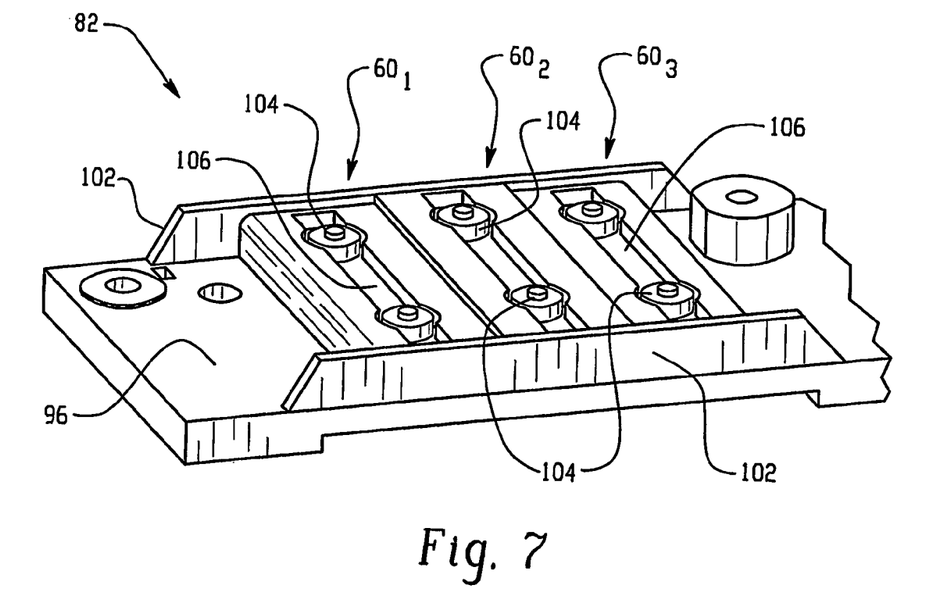
FIG. 7 shows a closer perspective view of one of the moldings of FIG. 5 along with a portion of the separately molded tray.
Figure 8:
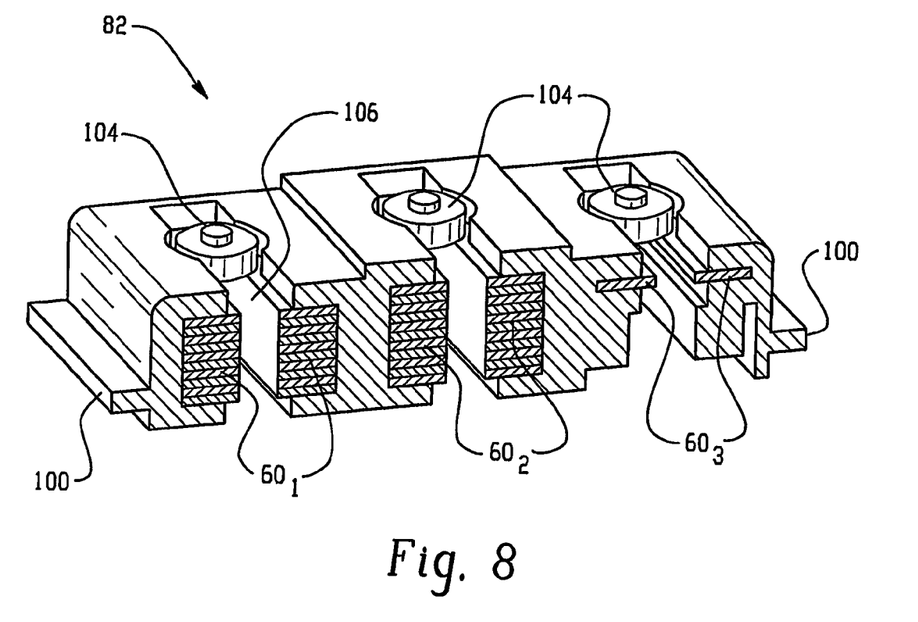
FIG. 8 shows a perspective sectional view of the molding and tray portion of FIG. 7, with the encapsulated shim packs revealed by the section.

With particular reference to FIGS. 7 and 8, the exemplary molding 82 encapsulates fixed shim packs $60_1$, $60_2$, $60_3$. The plates of steel or other magnetic material are riveted together by rivets 104 to form the shim packs $60_1$, $60_2$, $60_3$ prior to encapsulation. The number of magnetic plates in each shim pack may in general be different. For example, FIG. 8 shows that the shim packs $60_1$, $60_2$ contain more magnetic plates than the shim pack $60_3$. In a preferred embodiment, the shim packs $60_1$, $60_2$, $60_3$ are positioned in a mold using a spring-biased pin or other molding fixture, and the plastic molding 82 is molded around the steel by injection molding, resin transfer molding (RTM), compression molding, or another suitable technique. The molding fixture is removed through openings 106 in the molding 82.

A consideration in selecting the molding material is thermal matching with the steel or other magnetic material. A large thermal mismatch can cause cracking or other damage during setting of the molding 82. The inventors have performed thermal simulations and have determined that the ultimate strain of the encapsulation material is defined according to:

$$\epsilon_{ult} \geq (\Delta\alpha \cdot \Delta T) F.S. \quad (1),$$

where $$\Delta\alpha = \alpha_{encapsulation} - \alpha_{shim} \quad (2),$$

$$\Delta T = T_g - T_{min} \quad (3),$$

$\epsilon_{ult}$ is the ultimate strain of the encapsulation material, $\alpha_{encapsulation}$ is the coefficient of thermal expansion of the encapsulation material, $\alpha_{shim}$ is the coefficient of thermal expansion of the shim material, $T_g$ is the glass transition temperature of the encapsulation material, $T_{min}$ is a minimum use temperature, and F.S. is a factor of safety. In a preferred embodiment, the molding 82 is made of Ultem® (a polyetherimide thermoplastic of General Electric with a thermal coefficient of expansion of $5.6 \times 10^{-5}$ mm/mm·°C.). Ultem® has a relatively large ultimate strain of about 60%, an advantageous U.L. rating, and high strength, toughness, and stability. However, other thermal plastics can be selected in accordance with Equations (1)-(3). When using the preferred Ultem® encapsulation material, the molding 82 is advantageously annealed for between four and eight hours to accelerate stress relief. Alternatively, stress relief occurs without annealing over a period of about one to two weeks. In one embodiment, the corners of the fixed shim packs $60_1$, $60_2$, $60_3$ are rounded to reduce stresses at the corners.

With particular reference returning to FIGS. 5 and 6, the moldings 82, 84, 86, 88, 90, 92 are also designed to withstand substantial forces exerted on the fixed shim packs $60_1$, $60_2$, $60_3$, $60_4$, $60_5$, $60_6$, $60_7$, $60_8$, $60_9$, $60_{10}$, $60_{11}$, $60_{12}$ by the main $B_0$ magnetic field and by magnetic field gradients. One technique used to reduce these forces is force balancing within the moldings. That is, two or three shim packs in a single molding are preferably force balanced such that they exert a compressive force on molding material between the shim packs. The Ultem® molding material is more resistant to compressive stress than tensile stress. Rather than using a plurality of moldings 82, 84, 86, 88, 90, 92 that are bonded to a separately molded tray 96, it is contemplated to make a single molding that encompasses the fixed shim packs $60_1$, $60_2$, $60_3$, $60_4$, $60_5$, $60_6$, $60_7$, $60_8$, $60_9$, $60_{10}$, $60_{11}$, $60_{12}$.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

Having described the preferred embodiments, the invention is now claimed to be:

1. A magnetic resonance imaging scanner including:
   a generally cylindrical main magnet assembly that defines a cylinder axis;
   a first set of shims rigidly positioned inside the main magnet assembly at about a first distance relative to the cylinder axis, the first set of shims including a generally cylindrical dielectric former, packets of magnetic material disposed on the generally cylindrical dielectric former, and plastic encapsulation encapsulating the packets of magnetic material, wherein the plastic encapsulation includes openings through which molding fixtures are removed;
   a second set of shims rigidly positioned inside the main magnet assembly at about a second distance relative to the cylinder axis, the second distance being different from the first distance;
   a generally cylindrical radio frequency coil arranged inside the main magnet assembly at about a third distance relative to the cylinder axis; and
   a plurality of gradient coils arranged inside the main magnet assembly at about a fourth distance relative to the cylinder axis.

2. The magnetic resonance imaging scanner as set forth in claim 1, wherein the first distance equals the third distance.

3. The magnetic resonance imaging scanner as set forth in claim 1, wherein the first set of shims has a radial symmetry respective to the cylinder axis.

4. The magnetic resonance imaging scanner as set forth in claim 3, wherein the first set of shims has a bilateral symmetry respective to a longitudinal symmetry plane that is perpendicular to the cylinder axis.

5. The magnetic resonance imaging scanner as set forth in claim 4, wherein the second set of shims is asymmetric about at least one of the cylinder axis and the longitudinal plane of symmetry.

6. The magnetic resonance imaging scanner as set forth in claim 1, wherein the plastic encapsulation includes:
   a separately molded trays each securing one or more of the packets of magnetic material to the generally cylindrical dielectric former.

7. The magnetic resonance imaging scanner as set forth in claim 1, wherein the plastic encapsulation has a coefficient of thermal expansion $\alpha_{encapsulation}$ such that $\epsilon_{ult} \geq (\Delta\alpha \cdot \Delta T)$F.S., where $\Delta\alpha = \alpha_{encapsulation} - \alpha_{shim}$, $\Delta T = T_g - T_{min}$, $\epsilon_{ult}$ is the ultimate strain of the encapsulation material, $\alpha_{encapsulation}$, is the coefficient of thermal expansion of the encapsulation material, $\alpha_{shim}$ is the coefficient of thermal expansion of the shim material, $T_g$ is the glass transition temperature of the encapsulation material, $T_{min}$ is a minimum use temperature, and F.S. is a factor of safety.

8. The magnetic resonance imaging scanner as set forth in claim 1, wherein the plastic encapsulation is made of a polyetherimide thermoplastic.

9. The magnetic resonance imaging scanner as set forth in claim 1, wherein the packets of magnetic material each include:
   one or more steel plates secured together by at least one fastener.

10. The magnetic resonance imaging scanner as set forth in claim 9, wherein the steel plates have rounded edges to reduce stress between the steel plates and the plastic encapsulation.

11. The magnetic resonance imaging scanner as set forth in claim 1, wherein the first distance equals the third distance, and the radio frequency coil rungs are secured to the generally cylindrical dielectric former.

12. A magnetic resonance imaging scanner including:
    a generally cylindrical main magnet assembly that defines a cylinder axis;
    a first set of shims rigidly positioned inside the main magnet assembly at about a first distance relative to the cylinder axis, the first set of shims including a generally cylindrical dielectric former, packets of magnetic material disposed on the generally cylindrical dielectric former, and plastic encapsulation encapsulating the packets of magnetic material;
    a second set of shims rigidly positioned inside the main magnet assembly at about a second distance relative to the cylinder axis, the second distance being different from the first distance;
    a generally cylindrical radio frequency coil arranged inside the main magnet assembly at about a third distance relative to the cylinder axis; and
    a plurality of gradient coils arranged inside the main magnet assembly at about a fourth distance relative to the cylinder axis;
    wherein the radio frequency coil includes a plurality of rungs arranged generally parallel to the cylinder axis, wherein the packets of magnetic material are disposed at radial positions between the rungs.

13. The magnetic resonance imaging scanner as set forth in claim 12, wherein the first distance equals the third distance, and the radio frequency coil rungs are secured to the generally cylindrical dielectric former.

14. The magnetic resonance imaging scanner as set forth in claim 12, further including:
    shim rings arranged inside the main magnet assembly at a distance larger than the first distance and less than the second distance, the shim rings being arranged symmetrically relative to a longitudinal plane of symmetry.

15. The magnetic resonance imaging scanner as set forth in claim 12, wherein the first distance equals the third distance.

16. The magnetic resonance imaging scanner as set forth in claim 12, wherein the plastic encapsulation has a coefficient of thermal expansion $\alpha_{encapsulation}$ such that $\epsilon_{ult} \geq (\Delta\alpha \cdot \Delta T)$ F.S., where $\Delta\alpha = \alpha_{encapsulation} - \alpha_{shim}$, $\Delta T = T_g - T_{min}$, $\epsilon_{ult}$ is the ultimate strain of the encapsulation material, $\alpha_{encapsulation}$ is the coefficient of thermal expansion of the encapsulation material, $\alpha_{shim}$ is the coefficient of thermal expansion of the shim material, $T_g$ is the glass transition temperature of the encapsulation material, $T_{min}$ is a minimum use temperature, and F.S. is a factor of safety.

17. The magnetic resonance imaging scanner as set forth in claim 12, wherein the packets of magnetic material each include one or more steel plates secured together by at least one fastener, and the steel plates have rounded edges to reduce stress between the steel plates and the plastic encapsulation.

18. The magnetic resonance imaging scanner as set forth in claim 12, wherein the first set of shims has a radial symmetry respective to the cylinder axis.

19. The magnetic resonance imaging scanner as set forth in claim 12, wherein the plastic encapsulation is made of a polyetherimide thermoplastic.

20. A method of making a magnetic resonance scanner, the method including:
    rigidly positioning a first set of shims inside a main magnet assembly at about a first distance relative to a cylinder axis of the main magnet assembly by molding a plastic material around the first shims and bonding the molded plastic material to a generally cylindrical former;
    rigidly positioning a second set of shims inside the main magnet assembly at about a second distance relative to the cylinder axis, the second distance being different from the first distance;
    mounting a generally cylindrical radio frequency coil inside the main magnet assembly at about a third distance relative to the cylinder axis; and
    mounting a plurality of gradient coils inside the main magnet assembly at about a fourth distance relative to the cylinder axis.

21. The method as set forth in claim 20, wherein the molding includes:
    fastening the first shims in an injection mold using at least one fastener; and
    injection molding the plastic material around the first shims.

22. The method as set forth in claim 21, wherein the molding further includes:
    after the injection molding, removing the at least one fastener.

23. The method as set forth in claim 21, wherein the molding further includes:
    prior to the fastening of each first shim in the injection mold, binding a selected number of metal sheets together to define the first shim.

24. The method as set forth in claim 20, wherein the bonding of the molded plastic material to the generally cylindrical former includes:
    ultrasonically bonding the molded plastic material to a separately molded tray; and
    fastening the separately molded tray to the dielectric former.

25. The method as set forth in claim 20, wherein the molding of a plastic material around the first set of shims produces a plurality of moldings each including at least one shim of the first set of shims, and the bonding of the molded plastic material to the generally cylindrical former includes:
    bonding the moldings at radially spaced apart positions around the generally cylindrical former.

26. The method as set forth in claim 25, further including:
    securing rungs of the radio frequency coil to the generally cylindrical former in radial gaps between the moldings.

27. The method as set forth in claim 20, wherein the molding of the plastic material around the shim includes:
    molding the plastic material around the shim; and
    thermally annealing to relieve stress between the shim and the plastic material.

* * * * *